United States Patent
Faust et al.

(10) Patent No.: US 6,976,197 B2
(45) Date of Patent: Dec. 13, 2005

(54) APPARATUS AND METHOD FOR ERROR LOGGING ON A MEMORY MODULE

(75) Inventors: Robert Allan Faust, Austin, TX (US); Joel Gerard Goodwin, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 549 days.

(21) Appl. No.: 09/999,663

(22) Filed: Oct. 25, 2001

(65) Prior Publication Data

US 2003/0110426 A1    Jun. 12, 2003

(51) Int. Cl.$^7$ ............................................. G11C 29/00
(52) U.S. Cl. ..................................... 714/723; 714/718
(58) Field of Search .......................... 714/765, 5, 723, 714/718, 710, 767

(56) References Cited

U.S. PATENT DOCUMENTS

| | | | |
|---|---|---|---|
| 3,999,051 A | * | 12/1976 | Petschauer .................. 714/710 |
| 4,005,405 A | * | 1/1977 | West ........................... 714/765 |
| 5,410,545 A | | 4/1995 | Porter et al. ................ 371/21.6 |
| 5,774,647 A | | 6/1998 | Raynham et al. ...... 395/185.01 |
| 5,875,195 A | | 2/1999 | Dixon ......................... 371/21.2 |
| 6,038,680 A | | 3/2000 | Olarig ............................ 714/6 |
| 6,044,483 A | | 3/2000 | Chen et al. .................. 714/762 |
| 6,170,067 B1 | | 1/2001 | Liu et al. ...................... 714/48 |
| 6,505,305 B1 | * | 1/2003 | Olarig ............................ 714/5 |
| 6,567,950 B1 | * | 5/2003 | Bertin et al. ................ 714/767 |

OTHER PUBLICATIONS

IBM Research Disclosure 424100, "On Part Memory DIMM Error Logging", Aug. 1999, p. 1144.

* cited by examiner

Primary Examiner—David Ton
(74) Attorney, Agent, or Firm—Duke W. Yee; Mark E. McBurney; Lisa L.B. Yociss

(57) ABSTRACT

An apparatus and method for error logging on a memory module, such as a DIMM, are provided. If an error occurs in a memory module, the operating system of the computing device stores a log of the error in a storage device mounted to the memory module. The log may identify the type and quantity of errors caused by the faulty memory module and may also include defective bit identification information. The defective bit identification information may be used to identify individual memory elements on the memory module that are defective. If the errors exceed a given quality or quantity level, the operating system may store an indicator in the storage device on the memory module that the memory module is defective and take that memory module off-line to prevent problems from occurring with the programs that are running on the computing system.

31 Claims, 2 Drawing Sheets

APPARATUS AND METHOD FOR ERROR LOGGING ON A MEMORY MODULE

BACKGROUND OF THE INVENTION

1. Technical Field

The present invention is directed to an apparatus and method for error logging on a memory module.

2. Description of Related Art

In computing systems, the ability to detect hardware errors in memory has been available for many years. Recently, a mechanism for collecting memory errors and storing them in the computer system in a format in which the computer system user could identify which Dual In-line Memory Module (DIMM) sockets contain defective DIMMs has been devised.

However, this mechanism has the drawback that there is no connection maintained between the DIMM error data stored on the system and the defective DIMM. That is, the defective DIMM may be removed from the DIMM socket in the motherboard and there will be no way to identify the DIMM as being faulty based on the DIMM error data stored in the system. As a result, the faulty DIMM may be inserted into another DIMM socket on the same or a different computing system and may cause errors.

In order to avoid this drawback, International Business Machines Corporation (IBM) has devised a mechanism for recording the type and quantity of errors caused by a DIMM within a storage device mounted to the DIMM has been devised. This mechanism is described in IBM Research Disclosure 424100, entitled "On Part Memory DIMM Error Logging," disclosed by IBM in August, 1999. This mechanism, however, does not provide any ability to identify which memory elements on the memory module are faulty. Thus, while the DIMM may be identified as faulty, there is no way to identify which part of the DIMM is faulty without performing a detailed analysis of the DIMM prior to repairing the DIMM.

Furthermore, the information stored on the DIMM in the prior art mechanism is the functional status of the DIMM. This allows for any system to determine the operational condition of the DIMM and whether or not to configure the DIMM for system use. Even if the DIMM were moved to another system, that new system could determine that the DIMM had previously failed and not configure the defective DIMM for system usage. This simple status record does not contain the required additional information required to repair the defective DIMM.

Thus, it would be beneficial to have an apparatus and method for error logging in which the error log is permanently connected with the faulty DIMM and identifies which part of the DIMM is faulty in order to facilitate repair of the DIMM.

SUMMARY OF THE INVENTION

The present invention provides an apparatus and method for error logging on a memory module, such as a DIMM. With the present invention, if an error occurs in a memory module, the operating system of the computing device stores a log of the error in a storage device mounted to the memory module. The log may identify the type and quantity of errors caused by the faulty memory module.

If the errors exceed a given quality or quantity level, the operating system may store an indicator in the storage device on the memory module that the memory module is defective and take that memory module off-line to prevent problems from occurring with the programs that are running on the computing system.

In addition, the present invention stores information in a storage device physically attached to the memory module, indicating which memory devices on the memory module are faulty. In one particular embodiment, the information may include defective bit identification information. When the memory module is returned to a vendor for repair, the vendor may read the defective bit identification information and determine which memory element to replace in order to repair the memory module.

Hence, with the present invention, errors are logged in a device permanently attached to the memory module. In this way, even if the memory module were removed from the system, a record of the errors and the defective memory module stays with the memory module. Thus, the present invention prevents defective memory modules from being used when inserted into another memory module socket. These and other features and advantages of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENTS

The present invention is directed to an apparatus and method for error logging on a memory module, such as a DIMM, that experiences an error. The present invention may be implemented in a computing system having a motherboard with one or more memory module sockets in which one or more memory modules are placed. As such, a brief explanation of an exemplary computer system in which the present invention may be implemented will be provided.

In addition, the preferred embodiments of the present invention will be described in terms of a Dual In-line Memory Module (DIMM). However, the present invention is not limited to such. Rather, the present invention may be used with any known or later developed memory module without departing from the spirit and scope of the present invention.

Figure 1:
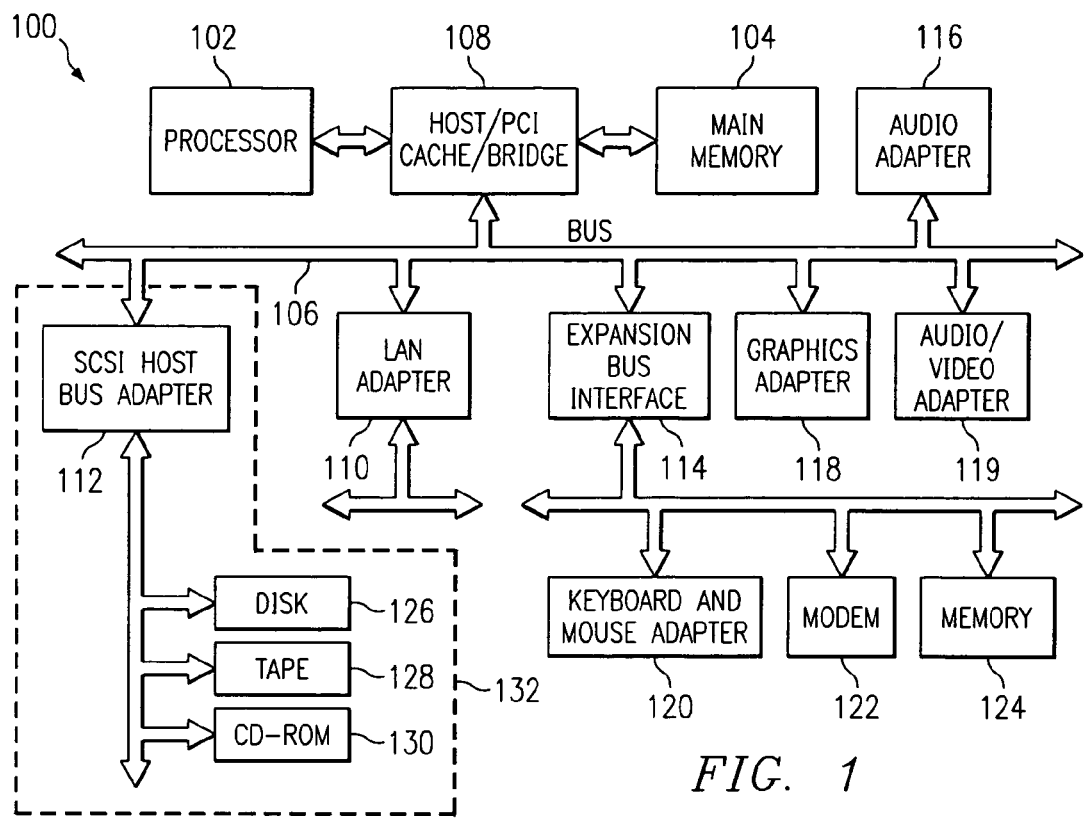
FIG. 1 is an exemplary diagram of a computing device in which the present invention may be implemented.

With reference now to FIG. 1, a block diagram illustrating a data processing system is depicted in which the present invention may be implemented. Data processing system 100 is an example of a client computer. Data processing system 100 employs a peripheral component interconnect (PCI) local bus architecture. Although the depicted example employs a PCI bus, other bus architectures such as Accelerated Graphics Port (AGP) and Industry Standard Architecture (ISA) may be used. Processor 102 and main memory 104 are connected to PCI local bus 106 through PCI bridge 108. PCI bridge 108 also may include an integrated memory controller and cache memory for processor 102. Additional connections to PCI local bus 106 may be made through direct component interconnection or through add-in boards. In the depicted example, local area network (LAN) adapter 110, SCSI host bus adapter 112, and expansion bus interface 114 are connected to PCI local bus 106 by direct component connection. In contrast, audio adapter 116, graphics adapter 118, and audio/video adapter 119 are connected to PCI local bus 106 by add-in boards inserted into expansion slots. Expansion bus interface 114 provides a connection for a keyboard and mouse adapter 120, modem 122, and additional memory 124. Small computer system interface (SCSI) host bus adapter 112 provides a connection for hard disk drive 126, tape drive 128, and CD-ROM drive 130. Typical PCI local bus implementations will support three or four PCI expansion slots or add-in connectors.

An operating system runs on processor 102 and is used to coordinate and provide control of various components within data processing system 100 in FIG. 1. The operating system may be a commercially available operating system, such as Windows 2000, which is available from Microsoft Corporation. An object oriented programming system such as Java may run in conjunction with the operating system and provide calls to the operating system from Java programs or applications executing on data processing system 100. "Java" is a trademark of Sun Microsystems, Inc. Instructions for the operating system, the object-oriented operating system, and applications or programs are located on storage devices, such as hard disk drive 126, and may be loaded into main memory 104 for execution by processor 102.

Those of ordinary skill in the art will appreciate that the hardware in FIG. 1 may vary depending on the implementation. Other internal hardware or peripheral devices, such as flash ROM (or equivalent nonvolatile memory) or optical disk drives and the like, may be used in addition to or in place of the hardware depicted in FIG. 1. Also, the processes of the present invention may be applied to a multiprocessor data processing system.

As another example, data processing system 100 may be a stand-alone system configured to be bootable without relying on some type of network communication interface, whether or not data processing system 100 comprises some type of network communication interface. As a further example, data processing system 100 may be a personal digital assistant (PDA) device, which is configured with ROM and/or flash ROM in order to provide nonvolatile memory for storing operating system files and/or user-generated data.

The depicted example in FIG. 1 and above-described examples are not meant to imply architectural limitations. For example, data processing system 100 also may be a notebook computer or hand held computer in addition to taking the form of a PDA. Data processing system 100 also may be a kiosk or a Web appliance.

With the present invention, the system firmware of the computing device is modified to include algorithms for detecting errors and writing error logs to a storage device located on a memory module that is the source of errors. The memory module is provided with an identity in the system device tree. When an error occurs, the system firmware removes the defective memory module, e.g., a DIMM, from the device tree. The operating system refers to the device tree to determine what are the available system resources. Thus, if the memory module experiences an error, the system firmware removes the memory module from the device tree and the operating system does not see the memory module as being an available resource.

The system firmware follows a defined format in which specific memory locations in the nonvolatile storage device on the memory module are used to save the memory element location information. The failing memory element is known because a Single Bit Error (SBE) has been detected by the system firmware. This error points directly to the defective memory element. If a threshold quantity or quality of errors is exceeded by a memory module, the system firmware generates a defective tag that is stored in the nonvolatile storage device on the defective memory module such that if the memory module were placed in a different socket, the memory module will not be configured for use in the device tree and used by the computing system. In this way, the record of errors and the defective nature of a memory module stays with the memory module and errors due to the placement of a defective memory module in a memory module socket are avoided.

With the present invention, the error log may include, for example, information identifying the defective bit associated with the error. This defective bit identification information may be stored for later use in repairing the faulty memory module. When a memory module is identified or tagged as defective, the memory module is removed from the computing system and sent to a vendor, or the like, for repair. The vendor may make use of tools for reading the error log from the storage device on the memory module. The error log includes the defective bit identification information which may be used to identify which memory element on the memory module is defective. Having identified the particular defective memory element, the vendor may simply replace the memory element and thereby, recycle the memory module.

Figure 2:
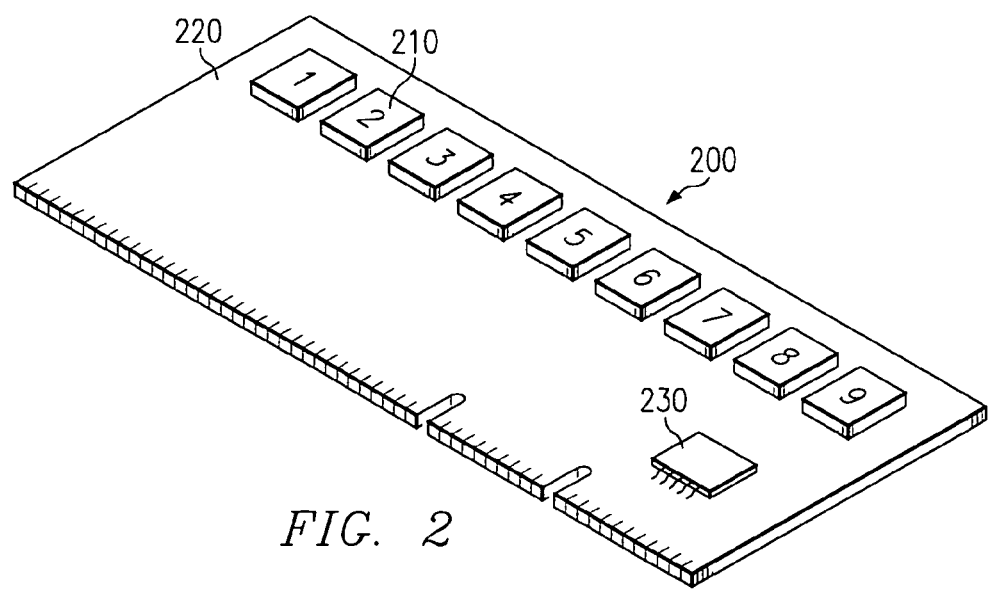
FIG. 2 is an exemplary diagram of a memory module according to the present invention.

FIG. 2 is an exemplary diagram of a memory module in accordance with the present invention. The memory module shown in FIG. 2 is a Dual In-line Memory Module (DIMM). However, as noted above, the present invention is not limited to such.

As shown in FIG. 2, the memory module 200, which in the depicted example is a DIMM, includes a plurality of individual memory elements 210 on a circuit board 220. Also mounted to the circuit board 220 is a storage device 230 for storing error logs and a defective tag if the DIMM becomes defective. The storage device 230 may be any suitable storage device for storing error logs and defective tags. In a preferred embodiment, the storage device 230 is an EEPROM module. However, other nonvolatile storage devices such as nonvolatile RAM (NV-RAM) and Flash technology may be used without departing from the spirit and scope of the present invention.

When an error occurs due to a defect or fault in the DIMM 200, such as a faulty memory element 210, the OS detects the error and stores a log of the error in the storage device 230. Errors may be, for example, a single bit error, double bit error, or the like. As previously mentioned, the error log includes defective bit identification information which may be used at a later time for identifying the particular memory element that is defective.

In order to understand how the defective bit information may be used to identify a faulty memory element on a memory module, such as a DIMM, it is first necessary to understand how the data is organized on a memory DIMM.

Referring again to FIG. 2, there are nine memory elements 210 on the DIMM 200. Eight of these memory elements 210 contain the actual data stored in the DIMM 200. The ninth memory element contains parity information for use in error correction.

Each memory element 210 has many input address data bits, but only one output data bit. If the memory elements 210 were numbered, starting from the left hand side of FIG. 2, from 1 to 8, the number of the memory element can be correlated to the bit position of a given byte in memory on the DIMM. This means that bit position 1 for all the bytes in the memory are located in memory element 1. Therefore, if it is determined which bit is defective in a byte, the defective bit can easily be correlated to the defective memory element 210.

All that is required to identify which module is defect is 1 byte of nonvolatile storage. The bits in the byte are numbered from 1 to 8 and with each bit corresponding to a respective one of the memory elements 210 on the DIMM 200. The system firmware detects and records the defective memory element 210 on the DIMM 200 by storing the defective bit. Later, the repair vendor reads the defective bit information off of the nonvolatile storage device 230 on the DIMM 200, replaces the corresponding defective memory element 210, and then updates the DIMM's operational status in the nonvolatile storage device 230.

During operation, if the quantity or quality of errors occurring due to the defective DIMM 200 exceed a predetermined threshold, the operating system may generate a defective tag that is stored in the storage device 230. When the operating system is first loaded during a boot up sequence of the computing device, the system firmware interrogates the storage devices 230 of all memory modules in the computing system. If a storage device 230 includes a defective tag, the memory module 200 is taken off-line, i.e. Removed or not included in the device tree, and is not used by the computing system. Alternatively, or in addition to performing this check at boot-up, this check may also be performed if the memory module 200 is hot-plugged into the computing device. In this way, errors that may occur in programs running on the computing system due to a defective memory module 200 are avoided.

Figure 3:
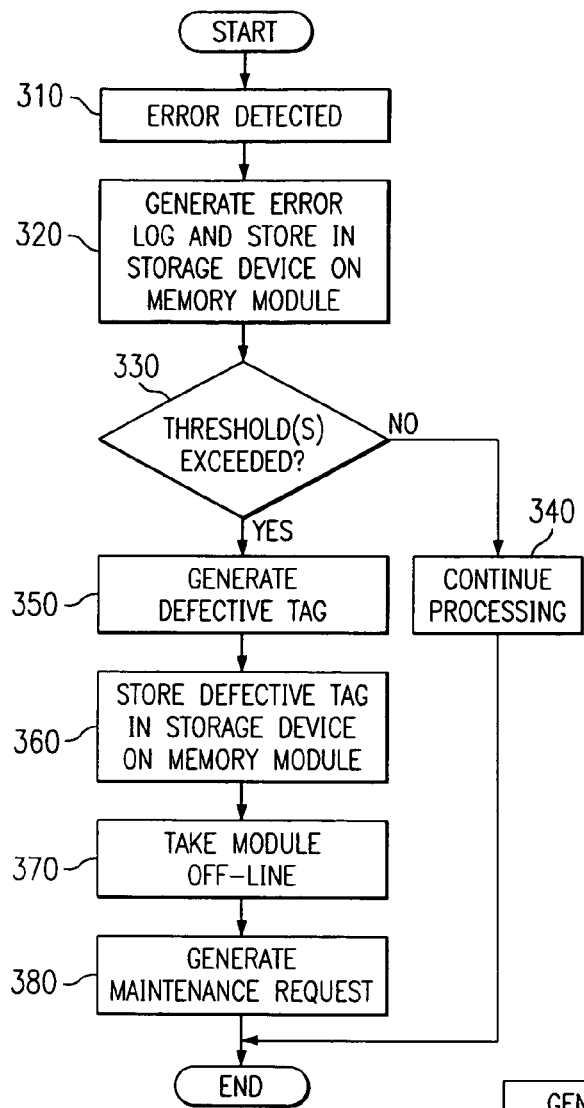
FIG. 3 is a high level flowchart outlining an exemplary operation of the present invention.

FIG. 3 is a high level flowchart outlining an exemplary operation of the present invention. As shown in FIG. 3, the operation starts with the detection of an error in a memory module (step 310). A log of the error is generated and stored in the storage device physically associated with the memory module (step 320). This error log includes defective bit identification information, as described earlier.

A determination is then made as to whether the number of errors or the type of errors generated by this memory module exceed a threshold (step 330). If not, processing continues (step 340) and the operation ends. If the threshold is exceeded, a defective tag is generated (step 350) and stored in the storage device physically associated with the memory module (step 360). The memory module is then taken off-line (step 370) and a maintenance request is generated (step 380). The maintenance request may be, for example, a message displayed to a user indicating that the memory module is defective and should be removed. The operation then ends.

As previously mentioned, the memory module may be taken off-line (step 370) by the system firmware. That is, the system firmware owns and controls the system device tree. Once the system firmware determines the operational status of the memory module, the system firmware will either place the memory module in the device tree if the memory module is functioning properly or not place the memory module in the device tree if the memory module experiences an error. The operating system then looks at the device tree to determine which resources are available for system use. The OS will notify the system user if resources that were available become unavailable. This is the user notification that system maintenance is required.

Figure 4:
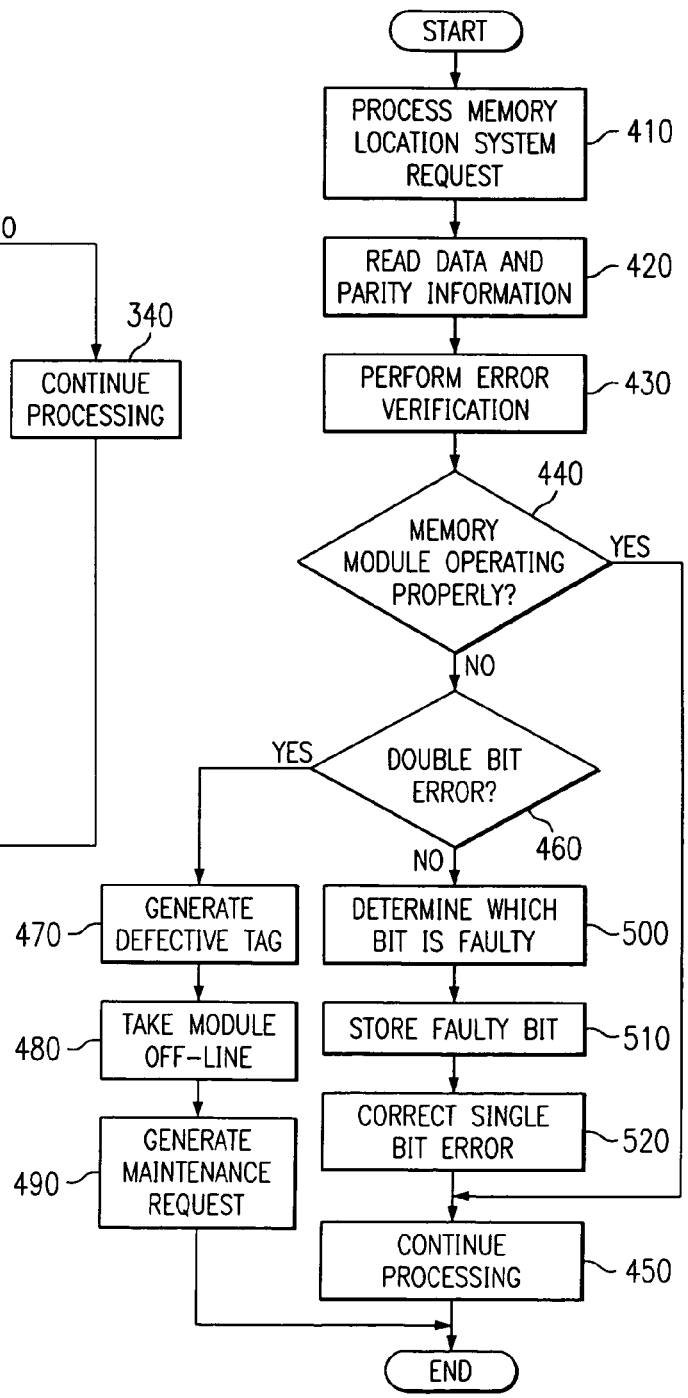
FIG. 4 is a flowchart outlining an exemplary error detection and logging operation according to a preferred embodiment of the present invention.

FIG. 4 is an exemplary operation of a preferred embodiment of the present invention. As shown in FIG. 4, the operation starts with the system request for a memory location being processed (step 410). The data and parity information are read from the memory module (step 420). Error verification is performed to determine if the memory module is faulty (step 430).

A determination is made as to whether the memory module error verification results in a determination that the memory module is operating properly (step 440). If the memory module is operating properly, processing is continued (step 450), and the operation ends. If the memory module is not operating properly, a determination is made as to whether there is a double bit error (step 460). If so, a defective tag is generated and stored in the storage device physically associated with the defective memory module (step 470) and the memory module is taken off-line (step 480). A maintenance message may also be generated (step 490).

If a double bit error did not occur, a single bit error occurred and a determination is made as to which bit is faulty (step 500). The defective bit is stored in the storage device physically associated with the memory module (step 510). The single bit error is then corrected (step 520) and processing is continued (step 450). The operation then ends.

Thus, the present invention provides a mechanism by which memory modules are permanently tagged with the errors caused by the memory modules. In addition, the memory modules may be tagged as defective such that they cannot be used again by placing them in a different socket in the same or a different computing system. Furthermore, these tags include defective bit identification information which may be used to replace individual memory elements on the memory module rather than having to discard the entire memory module or perform complicated analysis of the memory module to identify the defective memory elements.

With the present invention, use of defective memory modules is minimized and errors in the execution of programs in a computing system due to defective memory modules is avoided. Furthermore, memory modules may be more easily repaired and recycled due to the identification of the defective memory elements being stored on the memory module itself.

In an alternative embodiment, the defective bit information may be stored locally on the computing system rather than in the storage device physically connected to the memory module. In this way, a repair vendor may obtain the defective bit information from the computing system in order to determine which memory module and which memory element on the memory module is defective.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of logging errors on a memory module, comprising:
    detecting an error in the memory module and, in response to the detection, analyzing a storage byte, the memory module including a plurality of elements;
    determining which bit in said storage byte is faulty, said bit that is determined to be faulty corresponding to one of said plurality of elements; and
    logging the error as an error log in a storage device mounted to the memory module, wherein the error log includes defective bit identification information, said defective bit identification information storing said bit wherein said defective bit identification information utilizes a single bit to indicate one of said plurality of elements that caused said error.

2. The method of claim 1, wherein the memory module is a Dual In-line Memory Module (DIMM).

3. The method of claim 1, wherein the storage device is an EEPROM.

4. The method of claim 1, wherein logging the error in the storage device includes storing an identifier of the type of error and a quantity of errors caused by the memory module.

5. The method of claim 1, further comprising:
    determining if a quantity of errors caused by the memory module exceeds a threshold; and
    storing a defective identifier in the storage device if the quantity of errors exceeds the threshold.

6. The method of claim 1, further comprising:
    determining if a quality of the error exceeds a threshold; and
    storing a defective identifier in the storage device if the quality of the error exceeds the threshold.

7. The method of claim 1, further comprising: determining if the error is a double bit error;
    generating a defective tag if the error is a double bit error; and
    storing the defective tag in the storage device mounted to the memory module.

8. The method of claim 1, further comprising:
    determining if the error is a single bit error;
    identifying the defective bit; and
    storing the defective bit in the storage device mounted to the memory module.

9. The method of claim 1, further comprising:
    determining if the storage device stores a defective identifier; and
    placing the memory module off-line if the storage device stores a defective identifier.

10. The method of claim 9, further comprising:
    generating a maintenance message if the memory module is placed off-line.

11. A computer program product in a computer readable medium for logging errors on a memory module, comprising:
    first instructions for detecting an error in the memory module and, in response to the detection, analyzing a storage byte, the memory module including a plurality of elements;
    second instructions for determining which bit in said storage byte is faulty, said bit that was determined to be faulty corresponding to one of said plurality of elements; and
    third instructions for logging the error as an error log in a storage device mounted to the memory module, wherein the error log includes defective bit identification information, said defective bit identification information storing said bit wherein said defective bit identification information utilizes a single bit to indicate one of said plurality of elements that caused said error.

12. The computer program product of claim 11, wherein the memory module is a Dual In-line Memory Module (DIMM).

13. The computer program product of claim 11, wherein the storage device is an EE prom.

14. The computer program product of claim 11, wherein the third instructions for logging the error in the storage device include instructions for storing an identifier of the type of error and a quantity of errors caused by the memory module.

15. The computer program product of claim 11, further comprising:
    fourth instructions for determining if a quantity of errors caused by the memory module exceeds a threshold; and
    fifth instructions for storing a defective identifier in the storage device if the quantity of errors exceeds the threshold.

16. The computer program product of claim 11, further comprising:
    fourth instructions for determining if a quality of the error exceeds a threshold; and
    fifth instructions for storing a defective identifier in the storage device if the quality of the error exceeds the threshold.

17. The computer program product of claim 11, further comprising:
    fourth instructions for determining if the error is a double bit error;
    fifth instructions for generating a defective tag if the error is a double bit error; and
    sixth instructions for storing the defective tag in the storage device mounted to the memory module.

18. The computer program product of claim 11, further comprising:
    fourth instructions for determining if the error is a single bit error;
    fifth instructions for identifying the defective bit; and
    sixth instructions for storing the defective bit in the storage device mounted to the memory module.

19. The computer program product of claim 11, further comprising:
    fourth instructions for determining if the storage device stores a defective identifier; and
    fifth instructions for placing the memory module off-line if the storage device stores a defective identifier.

20. The computer program product of claim 19, further comprising:
sixth instructions for generating a maintenance message if the memory module is placed off-line.

21. An apparatus for logging errors on a memory module, comprising:
means for detecting an error in the memory module and, in response to the detection, analyzing a storage byte, the memory module including a plurality of elements;
means for determining which bit in said storage byte is faulty, said bit that was determined to be faulty corresponding to one of said plurality of elements; and
means for logging the error as an error log in a storage device mounted to the memory module, wherein the error log includes defective bit identification information, said defective bit identification information storing said bit wherein said defective bit identification information utilizes a single bit to indicate one of said plurality of elements that caused said error.

22. The apparatus of claim 21, wherein the memory module is a Dual In-line Memory Module (DIMM).

23. The apparatus of claim 21, wherein the storage device is an EE prom.

24. The apparatus of claim 21, wherein the means for logging the error in the storage device includes means for storing an identifier of the type of error and a quantity of errors caused by the memory module.

25. The apparatus of claim 21, further comprising:
means for determining if a quantity of errors caused by the memory module exceeds a threshold; and
means for storing a defective identifier in the storage device if the quantity of errors exceeds the threshold.

26. The apparatus of claim 21, further comprising:
means for determining if a quality of the error exceeds a threshold; and
means for storing a defective identifier in the storage device if the quality of the error exceeds the threshold.

27. The apparatus of claim 21, further comprising:
means for determining if the error is a double bit error;
means for generating a defective tag if the error is a double bit error; and
means for storing the defective tag in the storage device mounted to the memory module.

28. The apparatus of claim 21, further comprising:
means for determining if the error is a single bit error;
means for identifying the defective bit; and
means for storing the defective bit in the storage device mounted to the memory module.

29. The apparatus of claim 21, further comprising:
means for determining if the storage device stores a defective identifier; and
means for placing the memory module off-line if the storage device stores a defective identifier.

30. The apparatus of claim 29, further comprising:
means for generating a maintenance message if the memory module is placed off-line.

31. A method in a computer system of logging errors on a memory module, comprising:
identifying available ones of system resources within a device tree;
utilizing, by an operating system, said device tree to determine which ones of said system resources are available;
determining, by system firmware included in said computer system, an operational status of said memory module;
in response to determining that said memory module is operational, adding an identity of said memory module to said device tree;
in response to determining that said memory module is not operational, not adding an identity of said memory module to said device tree;
said memory module including a plurality of elements for storing information, each one of said plurality of elements having a plurality of input address bits and only one output data bit, wherein data that is stored in said memory module is stored in said plurality of elements;
said output data bit of each one of said plurality of elements correlating to a particular bit position for all bytes that are stored in said memory module;
each one of said plurality of elements being associated with a different one of a plurality of bits for all bytes that are stored in said memory module, each one of said plurality of bits specifying only a particular one of said plurality of elements;
detecting, by said system firmware, an error in said memory module;
in response to said detection, analyzing a storage byte that is currently stored in said memory module by analyzing an output data bit of each one of said plurality of elements that is included in said memory module;
determining which bit in said storage byte is faulty;
identifying one of said plurality of elements that is faulty by determining which one of said plurality of elements corresponds to said determined faulty bit;
logging, by said system firmware, the error as an error log in a non-volatile storage device that is mounted to the memory module, wherein the error log includes defective bit identification information, said defective bit identification information storing said faulty bit, said defective bit identification information utilizing a single bit to indicate only one of said plurality of elements that caused said error;
determining if a threshold of errors has been exceeded by said memory module;
in response to determining that said threshold has been exceeded, generating, by said system firmware, a tag, said tag identifying said memory module as being defective;
storing, by said system firmware, said tag in said storage device that is mounted on said memory module;
said tag preventing said memory module from being configured in said device tree when said tag is stored in said non-volatile memory;
in response to said tag being stored in said non-volatile storage device, taking, by said system firmware, said memory module off-line and removing an identity of said memory module from said device tree;
generating a maintenance request by displaying a message to a user that said memory module is defective; and
in response to said memory module being repaired, updating said non-volatile storage device.

* * * * *